(12) United States Patent
Song et al.

(10) Patent No.: US 11,456,438 B2
(45) Date of Patent: Sep. 27, 2022

(54) DISPLAY APPARATUS WITH THIN FILM ENCAPSULATION LAYER AND METHOD OF MANUFACTURING THE SAME

(71) Applicant: Samsung Display Co., LTD., Yongin-si (KR)

(72) Inventors: Chang Yeong Song, Suwon-si (KR); Won Jong Kim, Suwon-si (KR); Yi Su Kim, Seoul (KR); Jong Woo Kim, Hwaseong-si (KR); Hye In Yang, Siheung-si (KR); Woo Suk Jung, Yongin-si (KR); Yong Chan Ju, Yongin-si (KR); Jae Heung Ha, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/991,542

(22) Filed: Aug. 12, 2020

(65) Prior Publication Data
US 2021/0143369 A1 May 13, 2021

(30) Foreign Application Priority Data
Nov. 12, 2019 (KR) ........................ 10-2019-0144298

(51) Int. Cl.
*H01L 29/08* (2006.01)
*H01L 51/52* (2006.01)
*H01L 51/56* (2006.01)

(52) U.S. Cl.
CPC .......... *H01L 51/5253* (2013.01); *H01L 51/56* (2013.01); *H01L 2251/303* (2013.01)

(58) Field of Classification Search
CPC ...................... H01L 51/5253; H01L 2251/303
See application file for complete search history.

(56) References Cited

U.S. PATENT DOCUMENTS

2007/0043166 A1\* 2/2007 Hoshika ................ H01L 23/293
524/763
2012/0228668 A1 9/2012 Thoumazet et al.
2015/0115235 A1\* 4/2015 Lee ..................... H01L 27/3244
257/40

(Continued)

FOREIGN PATENT DOCUMENTS

JP 2017-147191 8/2017
KR 10-2012-0106453 9/2012

(Continued)

OTHER PUBLICATIONS

Kato et al., "Photo-induced refractive index change in hydrogenated amorphous silicon oxynitride" (Year: 2002).\*

*Primary Examiner* — Caleb E Henry
(74) *Attorney, Agent, or Firm* — Kile Park Reed & Houtteman PLLC

(57) ABSTRACT

A display apparatus includes a base substrate, a light emitting structure disposed on the base substrate, and a thin film encapsulation layer disposed on the light emitting structure and including at least one inorganic layer and at least one organic layer. The at least one inorganic layer includes a high density layer having a density of greater than or equal to about 2.0 g/cm$^3$ and a low density layer having a density of less than about 2.0 g/cm$^3$. The high density layer and the low density layer are in contact with each other.

10 Claims, 9 Drawing Sheets

(56) References Cited

U.S. PATENT DOCUMENTS

2015/0144930 A1   5/2015  Kim et al.
2019/0326554 A1*  10/2019 Zeng ...................... H01L 51/56
2020/0152913 A1*  5/2020  Noh .................. H01L 29/78696

FOREIGN PATENT DOCUMENTS

| KR | 10-2014-0102565 | 8/2014 |
| KR | 10-2015-0109557 | 10/2015 |
| KR | 10-2015-0121662 | 10/2015 |
| KR | 10-2017-0003768 | 1/2017 |
| KR | 10-1954220 | 3/2019 |

\* cited by examiner

DISPLAY APPARATUS WITH THIN FILM ENCAPSULATION LAYER AND METHOD OF MANUFACTURING THE SAME

CROSS-REFERENCE TO RELATED APPLICATION(S)

This application claims priority to and benefits of Korean Patent Application No. 10-2019-0144298 under 35 USC § 119, filed on Nov. 12, 2019 in the Korean Intellectual Property Office, the entire contents of which are incorporated herein by reference.

BACKGROUND

1. Technical Field

Embodiments relate generally to a display apparatus and a method of manufacturing the display apparatus. Embodiments of the inventive concept relate to a display apparatus having an improved display quality and a method of manufacturing the display apparatus.

2. Description of the Related Art

As technology improves, display products having smaller sizes, lighter weight, and superior performance have been produced. Conventional cathode ray tube (CRT) televisions have been widely used for display apparatuses with many advantages in terms of performance and price. Display apparatuses such as a plasma display apparatus, a liquid crystal display apparatus, and an organic light emitting display apparatus, possess technological features which overcome weak points of the CRT in terms of miniaturization or portability and have advantages such as miniaturization, light weight, and low power consumption.

An organic light emitting display apparatus may include a thin film encapsulation layer to encapsulate an organic light emitting structure disposed on a base substrate. The thin film encapsulation layer may have a configuration in which an inorganic layer and an organic layer are repeatedly arranged, and efforts have been made to improve the sealing property of the thin film encapsulation layer.

SUMMARY

Embodiments provide a display apparatus including a thin film encapsulation layer having an improved sealing property.

Embodiments provide a method of manufacturing the display apparatus.

According to embodiments, a display apparatus may include a base substrate, a light emitting structure disposed on the base substrate, and a thin film encapsulation layer disposed on the light emitting structure and including at least one inorganic layer and at least one organic layer. The at least one inorganic layer may include a high density layer having a density of greater than or equal to about 2.0 $g/cm^3$ and a low density layer having a density of less than about 2.0 $g/cm^3$. The high density layer and the low density layer may be in contact with each other.

In embodiments, the high density layer and the low density layer may include a same material.

In embodiments, the low density layer may have a refractive index of less than about 1.7.

In embodiments, the high density layer may include silicon oxynitride.

In embodiments, the thin film encapsulation layer may include a first inorganic layer, an organic layer disposed on the first inorganic layer, and a second inorganic layer disposed on the organic layer. The first inorganic layer may include the high density layer and the low density layer.

In embodiments, the low density layer may be disposed between the base substrate and the high density layer.

In embodiments, the high density layer may be disposed between the low density layer and the base substrate.

In embodiments, the high density layer may have a thickness in a range between about 1 nm and about 1 μm.

In embodiments, the at least one inorganic layer of the thin film encapsulation layer may include a lower high density layer having a density of greater than or equal to about 2.0 $g/cm^3$, a low density layer disposed on the lower high density layer and having a density of less than about 2.0 $g/cm^3$, and an upper high density layer disposed on the low density layer and having a density of greater than or equal to about 2.0 $g/cm^3$. The density layer may be in contact with the lower high density layer and the upper high density layer.

In embodiments, the base substrate may include a hole area (or referred to as an opening area) that transmits light, a hole peripheral area (or referred to as an opening peripheral area) that is adjacent to the hole area in a non-display area, a display area adjacent to the hole peripheral area; and a trench disposed at the hole peripheral area. The at least one inorganic layer may be disposed in the trench.

According to embodiments, a method of manufacturing a display apparatus may include forming a light emitting structure on a base substrate and forming a thin film encapsulation layer including at least one inorganic layer and at least one organic layer to cover the light emitting structure. The at least one inorganic layer of the thin film encapsulation layer may include a high density layer having a density of greater than or equal to about 2.0 $g/cm^3$ and a low density layer having a density of less than about 2.0 $g/cm^3$.

In embodiments, the forming of the thin film encapsulation layer may include forming a first inorganic layer having a density of less than about 2.0 $g/cm^3$ and converting an upper portion of the first inorganic layer into the high density layer by performing a post-treatment process on the first inorganic layer.

In embodiments, the first inorganic layer may be formed using a plasma enhanced chemical vapor deposition (PECVD) process. The post-treatment process may be a plasma treatment using hydrogen or hydrogen and nitrogen.

In embodiments, a plasma power in the post-treatment process may be in a range between about ⅓ and about 1 of a plasma power in the forming of the first inorganic layer.

In embodiments, a process pressure in the post-treatment process may be in a range between about 1 torr and about 1.8 torr.

In embodiments, the forming of the thin film encapsulation layer may include forming a lower inorganic layer having a density of less than about 2.0 $g/cm^3$, converting the lower inorganic layer into the high density layer by performing a post-treatment process on the lower inorganic layer, and forming an upper inorganic layer having a density of less than about 2.0 $g/cm^3$ on the high density layer.

In embodiments, the forming of the light emitting structure may include forming a first electrode on the base substrate, forming a light emitting layer on the first electrode, and forming a second electrode and a capping layer on the light emitting layer.

In embodiments, the method may further include forming a trench in the base substrate before the forming of the second electrode and the capping layer. A portion of the second electrode, a portion of the capping layer, and a portion of the at least one inorganic layer of the thin film encapsulation layer may be formed in the trench.

In embodiments, the high density layer may include silicon oxynitride.

In embodiments, the high density layer may have a thickness in a range between about 1 nm and about 1 μm.

According to the embodiments, the penetration of moisture from the outside may be effectively prevented. When a display apparatus includes a hole area for positioning an optical module such as a camera in a display area, the high density layer disposed in a trench may effectively prevent the penetration of moisture into the hole area where moisture may otherwise easily penetrate.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Figure 1:
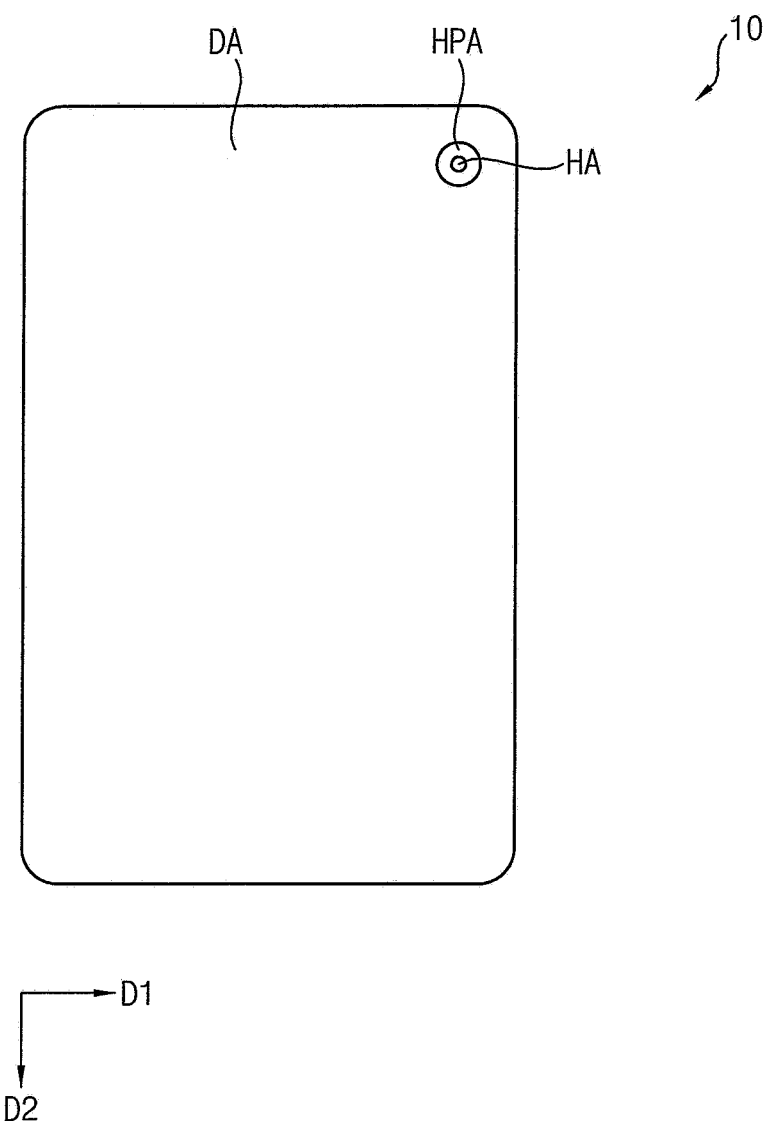
FIG. 1 is a schematic plan view illustrating a display apparatus according to embodiments.

Hereinafter, embodiments of the inventive concept will be explained in detail with reference to the accompanying drawings.

Like reference numerals refer to like elements throughout. In the drawings, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the invention. Similarly, a second element could be termed a first element. As used herein, the singular forms are intended to include the plural forms as well, unless the context clearly indicates otherwise.

As used herein, the term "and/or" includes any and all combinations of one or more of the associated listed items for the purpose of its meaning and interpretation. For example, "A and/or B" may be understood to mean "A, B, or A and B." The terms "and" and "or" may be used in the conjunctive or disjunctive sense and may be understood to be equivalent to "and/or". Throughout the disclosure, the expression "at least one of A, B or C" indicates only A, only B, only C, both A and B, both A and C, both B and C, all of A, B, and C, or variations thereof.

It will be further understood that the terms "comprises," "comprising," "includes," and/or "including," when used in this specification, specify the presence of stated features, numerals, steps, operations, elements, parts, or the combination thereof, but do not preclude the presence or addition of one or more other features, numerals, steps, operations, elements, parts, or the combination thereof.

It will be further understood that when a layer, a film, a region, a plate, etc. is referred to as being "on" or "above" another part, it can be "directly on" the other part, or intervening layers may also be present. It will also be understood that when a layer, a film, a region, a plate, etc. is referred to as being "under" or "below" another part, it can be "directly under" the other part, or intervening layers may also be present. When an element is referred to as being disposed "on" another element, it can be disposed under the other element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "in contact" or "contacted" or the like to another element, the element may be in electrical contact or in physical contact with another element; or in indirect contact or in direct contact with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±20%, 10%, or 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic plan view illustrating a display apparatus according to embodiments.

Referring to FIG. 1, the display apparatus 10 may include a display area DA where an image is displayed, a hole area HA for installing an optical module, and a hole peripheral area HPA which is a non-display area adjacent to the hole area HA. In an embodiment, the hole peripheral area HPA may be a non-display area surrounding the hole area HA.

The display area DA may be disposed on a plane defined by a first direction D1 and a second direction D2 perpendicular to the first direction D1. Pixels may be disposed in the display area DA to display an image. The display area DA may be adjacent to the hole peripheral area HPA. In an embodiment, the display area DA may surround the hole peripheral area HPA.

The hole peripheral area HPA may be adjacent to the hole area HA. In an embodiment, the hole peripheral area HPA may surround the hole area HA. The hole area HA may transmit light. For example, a circular hole formed through a base substrate or a transparent window may be formed in the hole area HA. An optical module (not shown) may be disposed to overlap the hole area HA.

The optical module (not shown) may be disposed in the hole area HA or may overlap the hole area HA. For example, the optical module may include a camera module capable of capturing (or recognizing) an image of an object, a face recognition sensor module for sensing a user's face, a pupil recognition sensor module for sensing user's eyes, an acceleration sensor module and a geomagnetic sensor module for determining a motion of the display apparatus, a proximity sensor module and an infrared sensor module for sensing proximity to the display apparatus, and an illuminance sensor module for measuring the degree of brightness when the display apparatus is left in a pocket or a bag.

Figure 2:
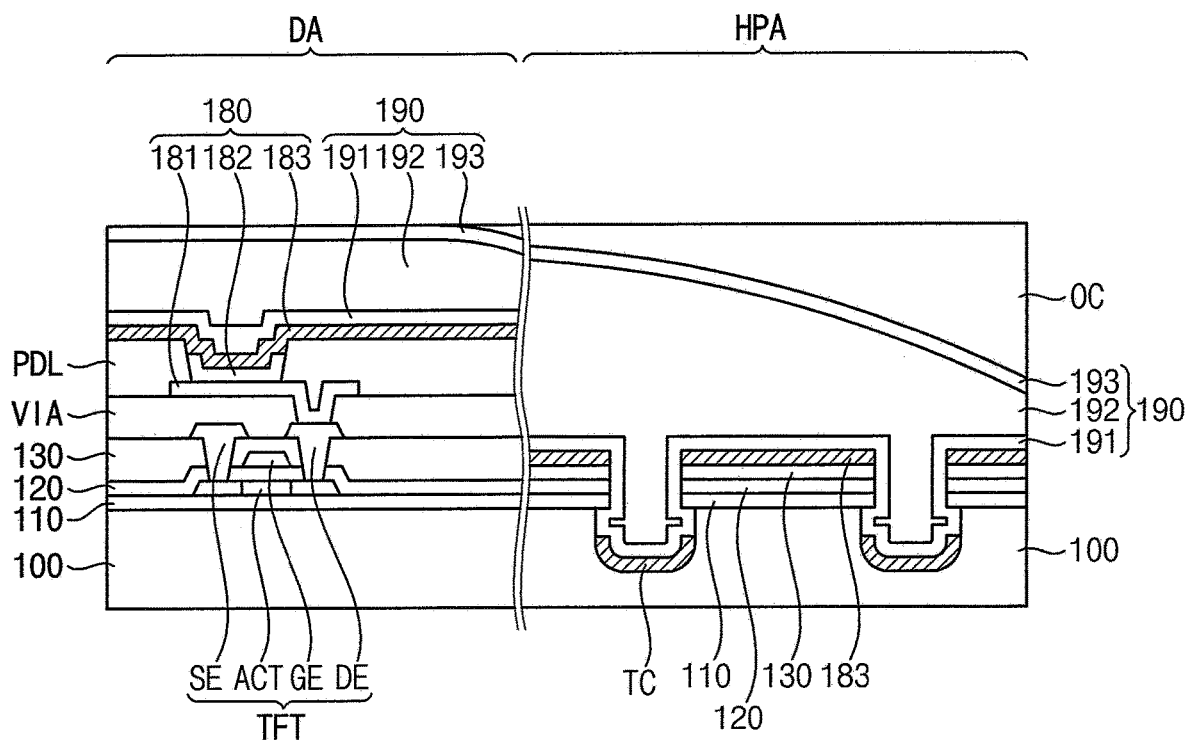
FIG. 2 is a schematic cross-sectional diagram illustrating a display area and a hole peripheral area in the display apparatus of FIG. 1.

FIG. 2 is a schematic cross-sectional diagram illustrating a display area and a hole peripheral area in the display apparatus of FIG. 1.

Figure 3:
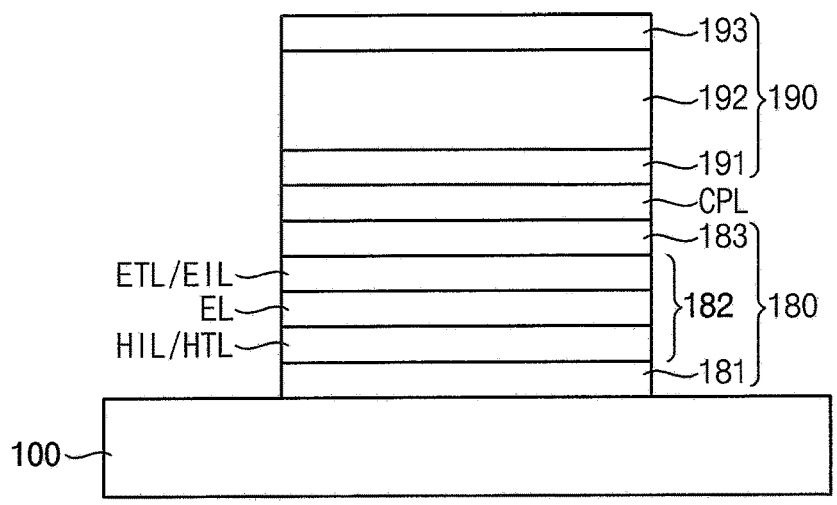
FIG. 3 is a schematic cross-sectional diagram illustrating a display apparatus according to embodiments.

Referring to FIGS. 2 and 3, the display apparatus 10 may include a base substrate 100, a buffer layer 110, a thin film transistor TFT including an active pattern ACT, a first insulating layer 120, a gate conductive layer, a second insulating layer 130, a source drain conductive layer, a via insulating layer VIA, a pixel defining layer PDL, a light emitting structure 180, a thin film encapsulation layer 190, and an overcoat layer OC.

The base substrate 100 may be formed of a transparent or opaque material. For example, the base substrate 100 may include a quartz substrate, a synthetic quartz substrate, a calcium fluoride substrate, a fluorine-doped quartz substrate, a soda lime glass substrate, a non-alkali glass substrate and the like. The base substrate 100 may be formed of a transparent resin substrate having flexibility. For example, the transparent resin substrate used as the base substrate 100 may include a polyimide substrate.

The buffer layer 110 may be disposed over the whole area of the base substrate 100. The buffer layer 110 may prevent diffusion of metal atoms or impurities from the base substrate 100 into the active pattern ACT, and may control the heat transfer rate during a crystallization process for forming the active pattern ACT in order to obtain a substantially uniform active pattern ACT.

The active pattern ACT of the thin film transistor TFT may be disposed on the buffer layer 110. The active pattern ACT may include amorphous silicon or polycrystalline silicon. In embodiments, the active pattern ACT may include an oxide of at least one material selected from the group consisting of indium (In), gallium (Ga), stannium (Sn), zirconium (Zr), vanadium (V), hafnium (Hf), cadmium (Cd), germanium (Ge), chromium (Cr), titanium (Ti) and zinc (Zn). The active pattern ACT may include a drain area and a source area doped with impurities and a channel area between the drain area and the source area.

The first insulating layer 120 may be disposed on the buffer layer 110 formed with the active pattern ACT. The first insulating layer 120 may cover the active pattern ACT on the buffer layer 110 and may be disposed to have the substantially same thickness along the profile of the active pattern ACT. The first insulating layer 120 may include a silicon compound, a metal oxide, or the like. The first insulating layer 120 may be formed as multiple layers.

The gate conductive layer may be disposed on the first insulating layer 120. The gate conductive layer may include signal wirings such as a gate electrode GE and a scan line of the thin film transistor TFT. The gate electrode GE may overlap or be disposed on the active pattern ACT. The gate conductive layer may be formed by using a metal, an alloy, a metal nitride, a conductive metal oxide, a transparent conductive material, or the like.

The second insulating layer 130 may be disposed on the first insulating layer 120 on which the gate conductive layer is disposed. Although the second insulating layer 130 is illustrated as to have a substantially flat upper surface without generating a step around the gate conductive layer, embodiments of the inventive concept are not limited thereto. The second insulating layer 130 may cover the gate conductive layer on the first insulating layer 120, and may be disposed to have the substantially same thickness along the profile of the gate conductive layer. The second insulating layer 130 may include a silicon compound, a metal oxide, or the like. The second insulating layer 130 may be formed as multiple layers.

The source drain conductive layer may be disposed on the second insulating layer 130. The source drain conductive layer may include source and drain electrodes SE and DE and data lines (not shown) of the thin film transistor TFT connected to the active pattern ACT through a contact hole formed through the second insulating layer 130 and the first insulating layer 120. The data conductive layer may be formed by using a metal, an alloy, a metal nitride, a conductive metal oxide, a transparent conductive material, or the like.

The via insulating layer VIA may be disposed on the second insulating layer 130 on which the source drain conductive layer is disposed. The via insulating layer VIA may be formed in a single layer structure, and may also be formed in a multilayer structure including at least two insulating layers. The via insulating layer VIA may be formed by using an organic material such as a photoresist, an acrylic resin, a polyimide resin, a polyamide resin, or a siloxane-based resin. In embodiments, the via insulating layer VIA may be formed by using an inorganic material such as a silicon compound, a metal, or a metal oxide.

The light emitting structure 180 may include a first electrode 181, a light emitting layer 182, and a second electrode 183.

The first electrode 181 may be disposed on the via insulating layer VIA. The first electrode 181 may be formed by using a reflective material or a transparent material depending on the light emission type of the display apparatus. For example, the first electrode 181 may include aluminum, an alloy containing aluminum, an aluminum nitride, silver, an alloy containing silver, tungsten, a tungsten nitride, copper, an alloy containing copper, nickel, chromium, a chromium nitride, molybdenum, an alloy containing molybdenum, titanium, a titanium nitride, platinum, tantalum, a tantalum nitride, neodymium, scandium, a strontium ruthenium oxide, a zinc oxide, an indium tin oxide, a tin oxide, an indium oxide, a gallium oxide, an indium zinc oxide or the like. The above elements may be used individually or in combination with each other. In embodiments, the first electrode 181 may be formed in a single layer structure or a multilayer structure including a metal film, an alloy film, a metal nitride film, a conductive metal oxide film, and/or a transparent conductive material film.

The pixel defining layer PDL may be disposed on the via insulating layer VIA on which the first electrode 181 is disposed. The pixel defining layer PDL may be formed by using an organic material, an inorganic material, or the like. For example, the pixel defining layer PDL may be formed by using a photoresist, a polyacrylic resin, a polyimide resin, an acrylic resin, a silicon compound, or the like. In embodiments, an opening that partially exposes the first electrode 181 may be formed by etching the pixel defining layer PDL. The display area and the non-display area of the display apparatus may be defined by the opening of the pixel defining layer PDL. For example, a portion where the opening of the pixel defining layer PDL is located may correspond to the display area, and the non-display area may correspond to a portion adjacent to the opening of the pixel defining layer PDL.

The light emitting layer 182 may be disposed on the first electrode 181 exposed through the opening of the pixel defining layer PDL. The light emitting layer 182 may extend onto a sidewall of the opening of the pixel defining layer PDL. In embodiments, the light emitting layer 182 may have a multilayer structure including an organic light emitting layer EL, a hole injection layer HIL, a hole transport layer HTL, an electron transport layer ETL, an electron injection layer EIL, or the like. Except for the organic light emitting layer EL, the hole injection layer HIL, the hole transport layer HTL, the electron transport layer ETL, and the electron injection layer EIL may be commonly formed to correspond to the pixels. Similar to the second electrode 183, these elements may be formed corresponding to the entire base substrate 100. The organic light emitting layer EL of the light emitting layer 182 may be formed by using light emitting materials capable of generating various color lights such as red light, green light, and blue light according to each pixel of the display apparatus. In embodiments, the organic light emitting layer EL of the light emitting layer 182 may have a structure for emitting white light by stacking light emitting materials capable of implementing various color lights such as red light, green light, and blue light. For example, the light emitting structures may be commonly formed to correspond to pixels, and the pixels may be divided by a color filter layer.

The second electrode 183 may be disposed on the pixel defining layer PDL and the light emitting layer 182. The second electrode 183 may include a light transmitting material or a reflective material depending on the light emitting type of the display apparatus. For example, the second electrode 183 may include aluminum, an alloy containing aluminum, an aluminum nitride, silver, an alloy containing silver, tungsten, a tungsten nitride, copper, an alloy containing copper, nickel, chromium, a chromium nitride, molybdenum, an alloy containing molybdenum, titanium, a titanium nitride, platinum, tantalum, a tantalum nitride, neodymium, scandium, a strontium ruthenium oxide, a zinc oxide, an indium tin oxide, a tin oxide, an indium oxide, a gallium oxide, an indium zinc oxide or the like. The above elements may be used individually or in combination with each other. In embodiments, the second electrode 183 may also be formed in a single layer structure or a multilayer structure including a metal film, an alloy film, a metal nitride film, a conductive metal oxide film, and/or a transparent conductive material film. A capping layer (see CPL of FIG. 3) may be further formed on the light emitting layer.

The thin film encapsulation layer 190 may be disposed on the light emitting structure 180. In an embodiment, the thin film encapsulation layer 190 may be disposed (e.g., directly disposed) on the second electrode 183. The thin film encapsulation layer TFE may prevent penetration of moisture and oxygen from the outside. The thin film encapsulation layer TFE may include at least one organic layer and at least one inorganic layer. The at least one organic layer and at least one inorganic layer may be alternately stacked with each other. For example, the thin film encapsulation layer TFE may include a first inorganic layer 191, a second inorganic layer 193, and an organic layer 192 between the first inorganic layer 191 and the second inorganic layer 193, but the inventive concept is not limited thereto.

The overcoat layer OC may be formed on the hole peripheral area HPA on the second inorganic layer 193 to compensate for the overall height of the display apparatus.

A trench TC may be formed in the base substrate 100 at the hole peripheral area HPA to be adjacent to (or to surround) the hole area HA when viewed in a plan view. Due to the trench TC, layers which are commonly formed, such as the hole injection layer HIL, the hole transport layer HTL, the electron transport layer ETL, and the electron injection layer EIL of the light emitting layer 180, the second electrode 183 and the capping layer CPL may be disconnected at the trench TC. When the first inorganic layer 191 of the thin film encapsulation layer 190 is formed to have excellent step coverage, the first inorganic layer 191 may be formed along a side surface of the trench TC.

Since the first inorganic layer 191 of the thin film encapsulation layer includes a high density layer having a density of greater than or equal to about 2.0 g/cm$^3$, it is possible to effectively prevent the penetration of moisture from the outside. The high density layer will be described below in detail with reference to FIG. 4.

FIG. 3 is a schematic cross-sectional diagram illustrating a display apparatus according to embodiments.

Referring to FIG. 3, the display apparatus may include a base substrate 100, a first electrode 181, a light emitting layer 182, a second electrode 183, a capping layer CPL, and a thin film encapsulation layer 190.

The first electrode 181 may be an anode for injecting holes.

The light emitting layer 182 may be disposed on the first electrode 181. The light emitting layer 182 may include a hole injection layer HIL, a hole transport layer HTL, an organic light emitting layer EL, an electron transport layer ETL, and an electron injection layer EIL.

The second electrode 183 may be disposed on the light emitting layer 182. The first electrode 183 may be a cathode for injecting electrons.

The capping layer CPL may be disposed on the second electrode 183. The capping layer may protect the light emitting structure 180 and at the same time allow the light emitted from the light emitting structure 180 to be efficiently emitted toward the outside.

The thin film encapsulation layer 190 may be disposed on the light emitting structure 180. In an embodiment, the thin film encapsulation layer 190 may be disposed (e.g. directly disposed) on the capping layer CPL. The thin film encapsulation may have a multilayer structure in which an inorganic film and an organic film are alternately stacked, and the thin film encapsulation layer 190 may protect the light emitting structure 180 by preventing the penetration of moisture and oxygen. The thin film encapsulation layer 190 may include a first inorganic layer 191, an organic layer 192, and a second inorganic layer 193.

Figure 4:
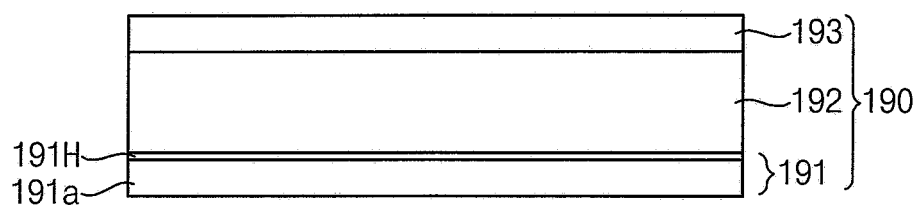
FIG. 4 is a schematic cross-sectional diagram illustrating a thin film encapsulation layer in a display apparatus according to embodiments.

FIG. 4 is a schematic cross-sectional diagram illustrating a thin film encapsulation layer in a display apparatus according to embodiments.

Referring to FIG. 4, the thin film encapsulation layer 190 may include a first inorganic layer 191, an organic layer 192, and a second inorganic layer 193.

The first inorganic layer 191 may include a low density layer 191a and a high density layer 191H.

The low density layer 191a may have a density of less than about 2.0 g/cm$^3$. The low density layer may have a refractive index of less than about 1.7. The high density layer 191H may be disposed on the low density layer 191a. The high density layer 191H and the low density layer 191a may be in contact with each other. The high density layer 191H may have a density of greater than or equal to about 2.0 g/cm$^3$. The high density layer 191H and the low density layer 191a may include a same material. The high density layer 191H may have a thickness in the range between about 1 nm and about 1 μm. As will be described below with reference to FIG. 9, the high density layer 191H may be formed on a part of an upper portion of the low density layer by performing densification through post-treatment such as plasma treatment.

The first inorganic layer 191 may include oxides or nitrides such as a silicon oxide, a silicon oxynitride, and a silicon nitride. For example, the first inorganic layer 191 may include silicon oxynitride (SiOxNy).

The organic layer 192 may be disposed on the first inorganic layer 191. The organic layer 192 may be formed of a polymer compound which is based on acrylate, epoxy, or the like.

The second inorganic layer 193 may be disposed on the organic layer 192. The second inorganic layer 193 may include an oxide or a nitride such as a silicon oxide, silicon oxynitride, or silicon nitride.

Figure 5:
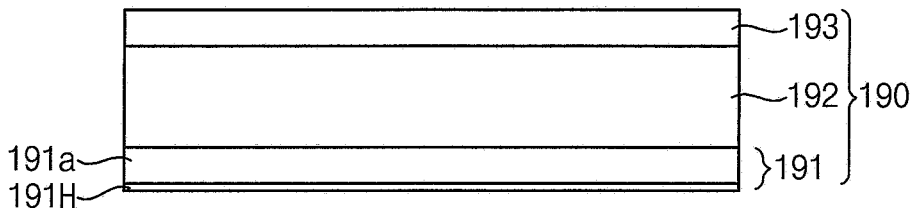
FIG. 5 is a schematic cross-sectional diagram illustrating a thin film encapsulation layer in a display apparatus according to embodiments.

FIG. 5 is a schematic cross-sectional diagram illustrating a thin film encapsulation layer in a display apparatus according to embodiments.

Referring to FIG. 5, the thin film encapsulation layer 190 is substantially the same as the thin film encapsulation layer of the display apparatus shown in FIG. 4 except for the positions of the high density layer 191H and the low density layer 191a. Therefore, the repeated description thereof will be omitted below.

The thin film encapsulation layer 190 may include a first inorganic layer 191, an organic layer 192, and a second inorganic layer 193. The first inorganic layer 191 may include a high density layer 191H and a low density layer 191a. The low density layer 191a may be disposed on the high density layer 191H. As will be described below with reference to FIG. 10, the high density layer 191H may be formed by performing densification through post-treatment such as plasma treatment after forming a lower low density layer. The low density layer 191a may be formed.

Figure 6:
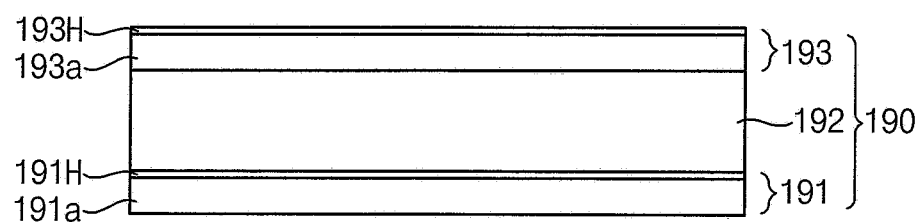
FIG. 6 is a schematic cross-sectional diagram illustrating a thin film encapsulation layer in a display apparatus according to embodiments.

FIG. 6 is a schematic cross-sectional diagram illustrating a thin film encapsulation layer in a display apparatus according to embodiments.

Referring to FIG. 6, the thin film encapsulation layer 190 is substantially the same as the thin film encapsulation layer of the display apparatus shown in FIG. 4 except that the high density layer 193H is additionally formed on the second inorganic layer 193. Therefore, the repeated description thereof will be omitted below.

The thin film encapsulation layer 190 may include a first inorganic layer 191, an organic layer 192, and a second inorganic layer 193. The first inorganic layer 191 may include a low density layer 191a and a high density layer 191H disposed on the low density layer 191a. The second inorganic layer 193 may include a low density layer 193a and a high density layer 193H disposed on the low density layer 193a.

According to this embodiment, the effect of preventing the penetration of moisture from the outside may be improved by the high density layer having a double configuration.

Figure 7:
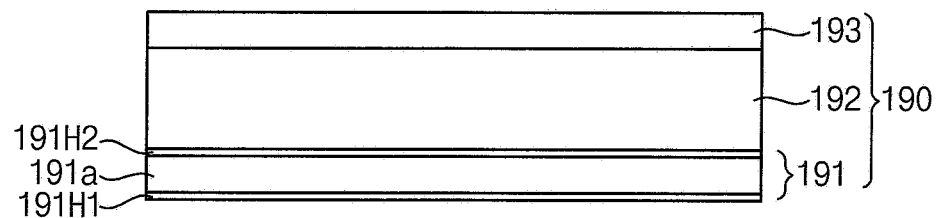
FIG. 7 is a schematic cross-sectional diagram illustrating a thin film encapsulation layer in a display apparatus according to embodiments.

FIG. 7 is a schematic cross-sectional diagram illustrating a thin film encapsulation layer in a display apparatus according to embodiments.

Referring to FIG. 7, the thin film encapsulation layer 190 is substantially the same as the display apparatus shown in FIG. 4 except that a first high density layer 191H1 and a second high density layer 191H2 are doubly formed on the first inorganic layer 191. Therefore, the repeated description thereof will be omitted below.

The thin film encapsulation layer 190 may include a first inorganic layer 191, an organic layer 192, and a second inorganic layer 193. The first inorganic layer 191 may include a first high density layer 191H1, a low density layer 191a disposed on the first high density layer 191H1, and a second high density layer 191H2 disposed on the low density layer 191a.

Figure 8:
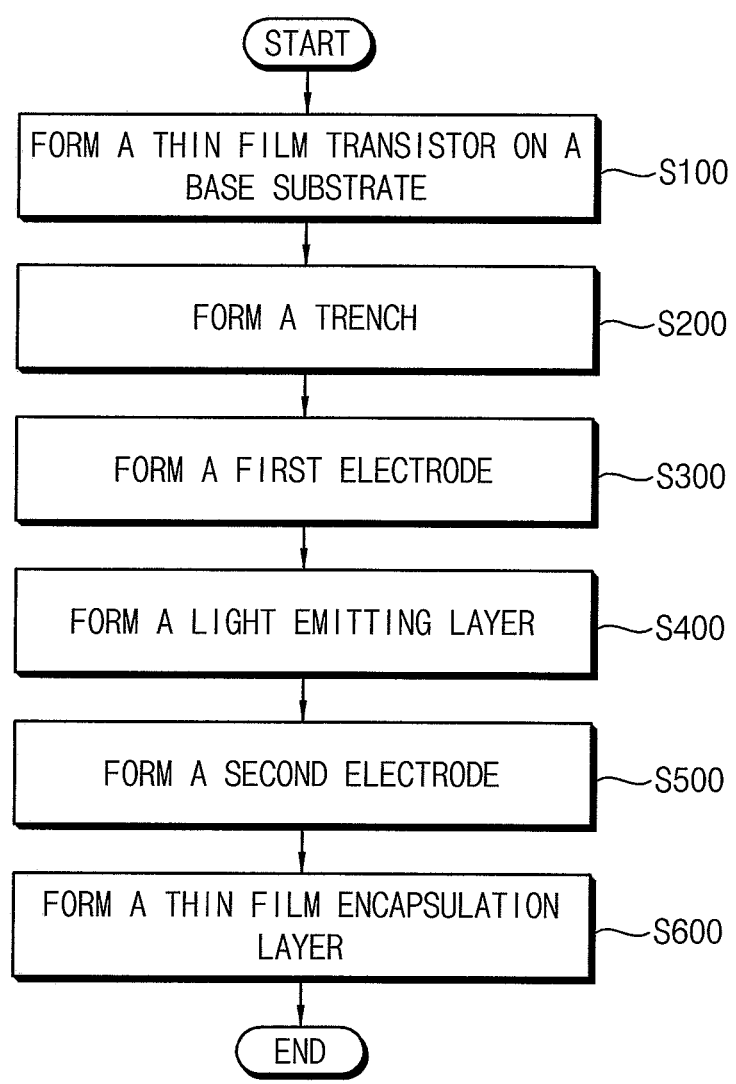
FIG. 8 is a flowchart illustrating a method of manufacturing a display apparatus according to embodiments.

FIG. 8 is a flowchart illustrating a method of manufacturing a display apparatus according to embodiments.

Referring to FIG. 8, the method of FIG. 8 may include forming a thin film transistor on a base substrate (S100), forming a trench (S200), forming a first electrode (S300), forming a light emitting layer (S400), forming a second electrode (S500), and forming a thin film encapsulation layer (S600).

In the operation (S100) of forming the thin film transistor on the base substrate, a thin film transistor and insulating layers may be formed on the base substrate.

In the operation (S200) of forming the trench, the trench may be formed in the base substrate.

In the operation (S300) of forming the first electrode, a first electrode may be formed on the thin film transistor and the insulating layers.

In the operation (S400) of forming the light emitting layer, the light emitting layer may be formed on the first electrode.

In the operation (S500) of forming the second electrode, the second electrode may be formed on the light emitting layer.

In the operation (S600) of forming the thin film encapsulation layer, a thin film encapsulation layer may be formed on the second electrode.

Figure 9:
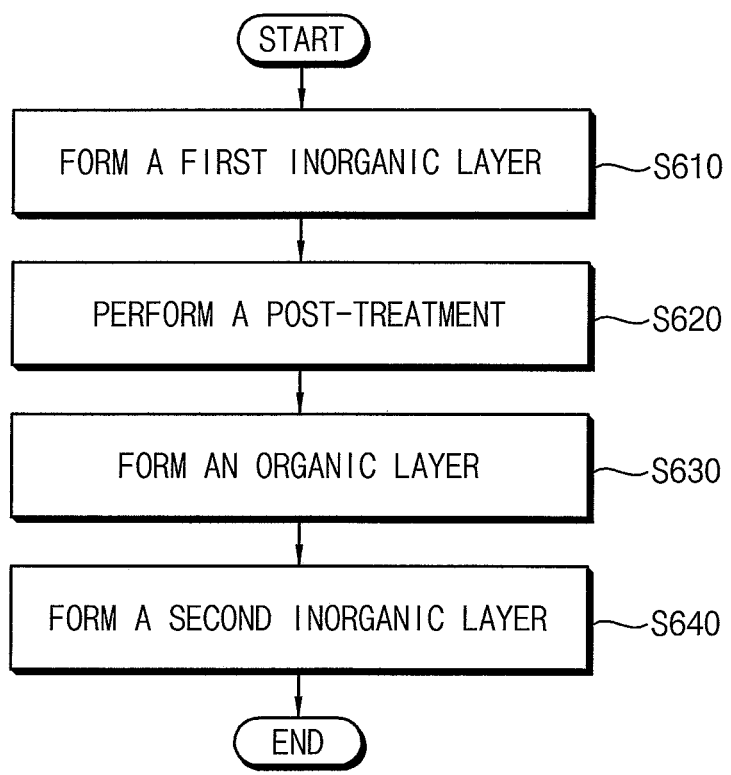
FIG. 9 is a flowchart illustrating the formation of a thin film encapsulation layer by a method of manufacturing a display apparatus according to embodiments.

FIG. 9 is a flowchart illustrating that a thin film encapsulation layer is formed by a method of manufacturing a display apparatus according to embodiments.

Referring to FIG. 9, an operation of forming the thin film encapsulation layer may include forming a first inorganic layer (S610), performing a post-treatment (S620), forming an organic layer (S630), and forming a second inorganic layer (S640).

In the operation (S610) of forming the first inorganic layer, a low density layer of the first inorganic layer may be formed. The low density layer may have a density of less than about 2.0 g/cm$^3$. The low density layer may include silicon oxynitride (SiOxNy). In the operation (S610) of forming the first inorganic layer, the low density layer may be formed by using a plasma enhanced chemical vapor deposition (PECVD) process, wherein $SiH_4$, $N_2O$, $NH_3$, $N_2O$, and/or $H_2$ may be used as process gas.

In the operation (S620) of performing the post-treatment, a post-treatment process may be performed on an upper portion of the low density layer to convert the upper portion of the low density layer into a high density layer. The post-treatment process may be a plasma treatment process using hydrogen or both hydrogen and nitrogen.

For example, the plasma power in the post-treatment process may be in the range between about ⅓ and about 1 of the plasma power for forming the low density layer. The process pressure in the post-treatment process may be higher than the process pressure for forming the low density layer. For example, the process pressure in the post-treatment process may be in the range between about 1 torr and about 1.8 torr.

It can be seen that the thickness of the first inorganic layer including the low density layer and the high density layer is reduced by the post-treatment process, from which the formation of the high density layer can be confirmed (see Table 1 below), and the post treatment time may be adjusted in order to obtain an appropriate thickness of the high density layer.

TABLE 1

| Post-treatment time (s) | 0 | 60 | 120 | 240 |
|---|---|---|---|---|
| Thickness (Å) | 3238 | 3219 | 3140 | 3040 |

In the operation (S630) of forming the organic layer, an organic layer may be formed on the first inorganic layer.

In the operation (S640) of forming the second inorganic layer, a second inorganic layer may be formed on the organic layer.

Figure 10:
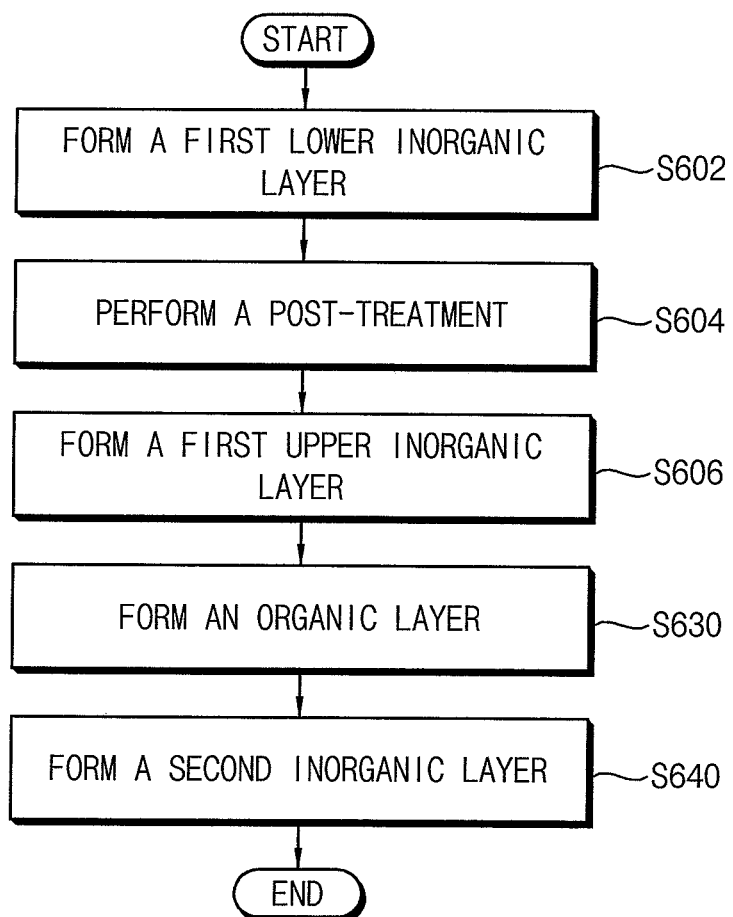
FIG. 10 is a flowchart illustrating the formation of a thin film encapsulation layer by a method of manufacturing a display apparatus according to embodiments.

FIG. 10 is a flowchart illustrating the formation of a thin film encapsulation layer by a method of manufacturing a display apparatus according to embodiments.

Referring to FIG. 10, an operation of forming the thin film encapsulation layer may include forming a first lower inorganic layer (S602), performing a post-treatment (S604), forming a first upper inorganic layer (S606), forming an organic layer (S630), and forming a second inorganic layer (S640).

The operation of forming the thin film encapsulation layer is substantially the same as the operation of forming the thin film encapsulation layer shown in FIG. 9 except that a first lower inorganic layer, which is a low density layer, is formed in the operation (S602) of forming the first lower inorganic layer, the first lower inorganic layer is subject to the post-treatment process to form a high density layer in the operation (S604) of performing the post-treatment, and a low density layer is again formed on the high density layer in the operation (S606) of forming the first upper inorganic layer, in order to form the high density layer under the low density layer. Therefore, the repeated description thereof will be omitted below.

Figure 11:
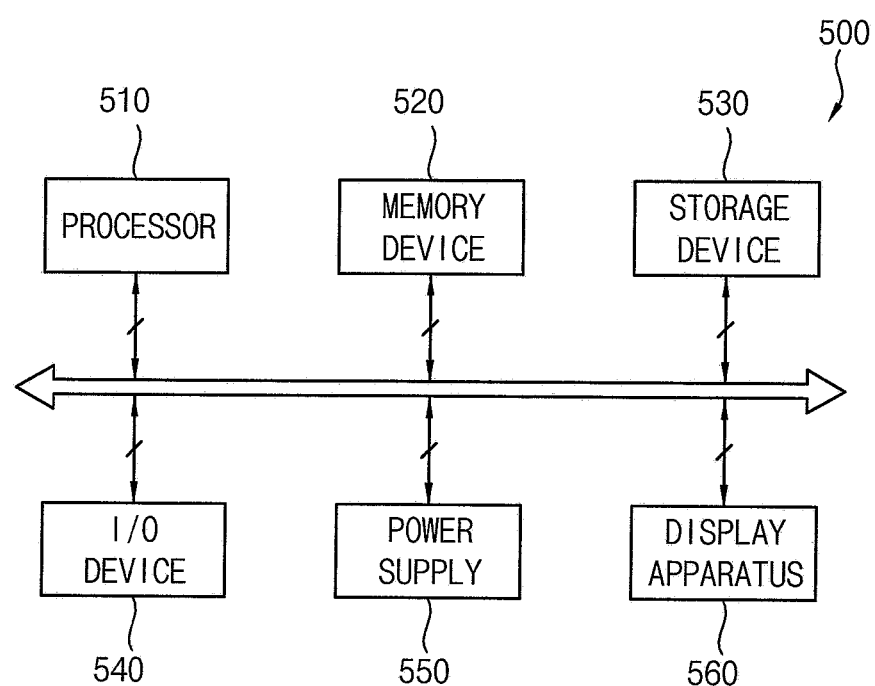
FIG. 11 is a block diagram illustrating an electronic apparatus according to embodiments.
Figure 12:
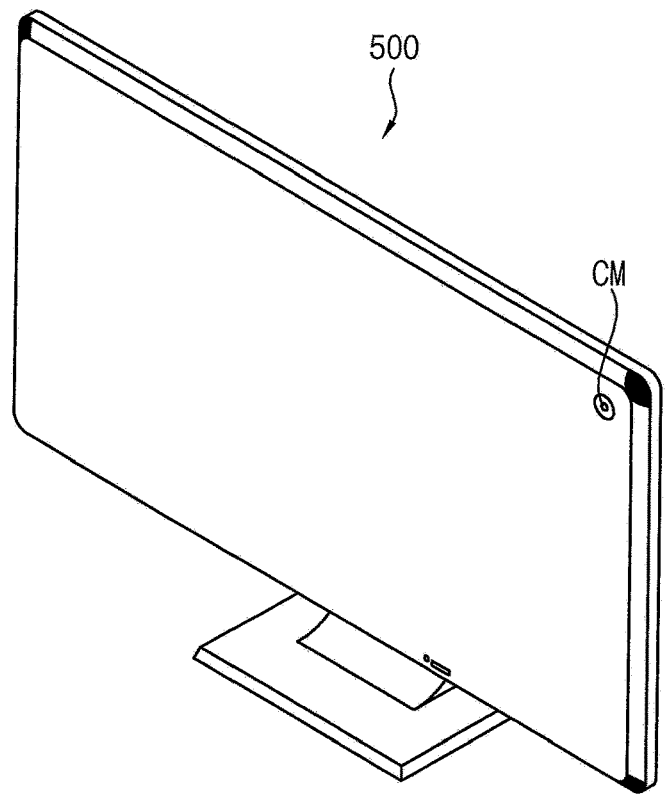
FIG. 12 is a diagram illustrating an embodiment in which the electronic apparatus of FIG. 11 is implemented as a television.
Figure 13:
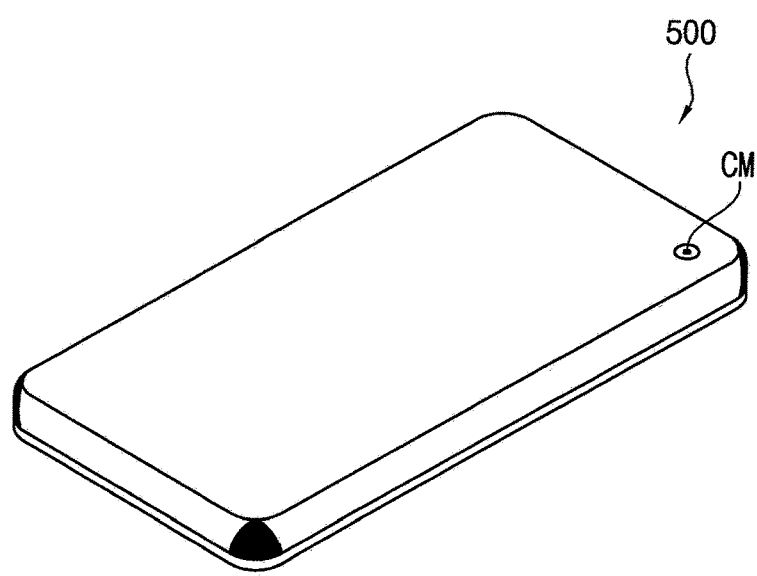
FIG. 13 is a diagram illustrating an embodiment in which the electronic apparatus of FIG. 11 is implemented as a smart phone.

FIG. 11 is a block diagram illustrating an electronic apparatus according to embodiments, FIG. 12 is a diagram illustrating an embodiment in which the electronic apparatus of FIG. 11 is implemented as a television, and FIG. 13 is a diagram illustrating an embodiment in which the electronic apparatus of FIG. 11 is implemented as a smart phone.

Referring to FIGS. 11 to 13, the electronic apparatus 500 may include a processor 510, a memory device 520, a storage device 530, an input/output (I/O) device 540, a power supply 550, and a display apparatus 560. Here, the display apparatus 560 may be the display apparatus of FIG. 1. The electronic apparatus 500 may further include ports for communicating with a video card, a sound card, a memory card, a universal serial bus (USB) device, other electronic apparatuses, etc. In an embodiment, as illustrated in FIG. 12, the electronic apparatus 500 may be implemented as a television. In another embodiment, as illustrated in FIG. 13, the electronic apparatus 500 may be implemented as a smart phone. However, the electronic apparatus 500 is not limited thereto. For example, the electronic apparatus 500 may be implemented as a cellular phone, a video phone, a smart pad, a smart watch, a tablet PC, a car navigation system, a computer monitor, a laptop, a head mounted display (HMD) apparatus, etc.

The processor 510 may perform various computing functions. The processor 510 may be a microprocessor, a central processing unit (CPU), an application processor (AP), etc. The processor 510 may be electrically coupled to other components via an address bus, a control bus, a data bus, etc. Further, the processor 510 may be coupled to an extended bus such as a peripheral component interconnection (PCI) bus. The memory device 520 may store data for operations of the electronic apparatus 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touch-pad, a touch-screen, etc., and an output device such as a printer, a speaker, etc. The power supply 550 may provide power for operations of the electronic apparatus 500.

The display apparatus 560 may be electrically connected with other components via buses or other communication links. In embodiments, the I/O device 540 may include the display apparatus 560. As described above, the display apparatus 560 may include a thin film encapsulation layer including at least one inorganic layer including a high density layer and a low density layer. Therefore, the penetration of moisture from the outside may be effectively prevented. For example, where a display apparatus includes a hole area for positioning an optical module such as a camera in a display area, the high density layer disposed in a trench may effectively prevent the penetration of moisture into the hole area where moisture may otherwise easily penetrate. Since these are described above, duplicated description related thereto will not be repeated.

The inventive concept may be applied to a display apparatus and an electronic apparatus including the display apparatus. For example, the inventive concept may be applied to a smart phone, a cellular phone, a video phone, a smart pad, a smart watch, a tablet PC, a car navigation system, a television, a computer monitor, a laptop, a head mounted display apparatus, etc.

The foregoing is illustrative of embodiments and is not to be construed as limiting thereof. Although some embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the claims.

What is claimed is:

1. A display apparatus comprising:
a base substrate;
a light emitting structure disposed on the base substrate; and
a thin film encapsulation layer disposed on the light emitting structure and including:
at least one inorganic layer; and
at least one organic layer, wherein
the at least one inorganic layer includes:
a high density layer having a density of greater than or equal to about 2.0 g/cm$^3$; and
a low density layer having a density of less than about 2.0 g/cm$^3$,
the high density layer and the low density layer are in contact with each other, and
the high density layer and the low density layer each consist of a same material.

2. The display apparatus of claim 1, wherein the high density layer is formed by performing densification on a part of the low density layer through plasma treatment.

3. The display apparatus of claim 1, wherein the high density layer consists of silicon oxynitride.

4. The display apparatus of claim 1, wherein the thin film encapsulation layer includes:
a first inorganic layer;
an organic layer disposed on the first inorganic layer; and
a second inorganic layer disposed on the organic layer, wherein the first inorganic layer includes the high density layer and the low density layer.

5. The display apparatus of claim 1, wherein the low density layer is disposed between the base substrate and the high density layer.

6. The display apparatus of claim 1, wherein the high density layer is disposed between the low density layer and the base substrate.

7. The display apparatus of claim 1, wherein the high density layer has a thickness in a range between about 1 nm and about 1 μm.

8. The display apparatus of claim 1, wherein the low density layer has a refractive index of less than about 1.7.

9. A display apparatus comprising:
a base substrate;
a light emitting structure disposed on the base substrate; and
a thin film encapsulation layer disposed on the light emitting structure and including:
at least one inorganic layer; and
at least one organic layer, wherein
the at least one inorganic layer includes:
a lower high density layer having a density of greater than or equal to about 2.0 g/cm$^3$;
a low density layer disposed on the lower high density layer and having a density of less than about 2.0 g/cm$^3$; and
an upper high density layer disposed on the low density layer and having a density of greater than or equal to about 2.0 g/cm$^3$, and
the low density layer is in contact with the lower high density layer and the upper high density layer.

10. A display apparatus comprising:
a base substrate;
a light emitting structure disposed on the base substrate; and
a thin film encapsulation layer disposed on the light emitting structure and including:
at least one inorganic layer; and
at least one organic layer, wherein
the at least one inorganic layer includes:
a high density layer having a density of greater than or equal to about 2.0 g/cm$^3$; and
a low density layer having a density of less than about 2.0 g/cm$^3$,
the high density layer and the low density layer are in contact with each other,
the base substrate includes:
a hole area that transmits light;
a hole peripheral area adjacent to the hole area in a non-display area;
a display area adjacent to the hole peripheral area; and
a trench disposed at the hole peripheral area, and
the at least one inorganic layer is disposed in the trench.

* * * * *